United States Patent
Hu et al.

(10) Patent No.: US 12,028,081 B2
(45) Date of Patent: Jul. 2, 2024

(54) FRACTIONAL-N FREQUENCY SYNTHESIZER BASED ON A CHARGE-SHARING LOCKING TECHNIQUE

(71) Applicant: UNIVERSITY COLLEGE DUBLIN, NATIONAL UNIVERSITY OF IRELAND, Dublin (IE)

(72) Inventors: Yizhe Hu, Dublin (IE); Teerachot Siriburanon, Dublin (IE); Robert Bodgan Staszewski, Dublin (IE)

(73) Assignee: UNIVERSITY COLLEGE DUBLIN & NATIONAL UNIVERSITY OF IRELAND, Dublin (IE)

( * ) Notice: Subject to any disclaimer, the term of this patent is extended or adjusted under 35 U.S.C. 154(b) by 59 days.

(21) Appl. No.: 17/792,636

(22) PCT Filed: Jan. 14, 2021

(86) PCT No.: PCT/EP2021/050746
§ 371 (c)(1),
(2) Date: Jul. 13, 2022

(87) PCT Pub. No.: WO2021/144393
PCT Pub. Date: Jul. 22, 2021

(65) Prior Publication Data
US 2023/0046326 A1    Feb. 16, 2023

(30) Foreign Application Priority Data

Jan. 14, 2020  (EP) .................................... 20151808

(51) Int. Cl.
*H03L 7/099*    (2006.01)
*H03L 7/04*    (2006.01)
*H03L 7/085*    (2006.01)

(52) U.S. Cl.
CPC .............. *H03L 7/0991* (2013.01); *H03L 7/04* (2013.01); *H03L 7/085* (2013.01)

(58) Field of Classification Search
CPC ........ H03L 7/093; H03L 7/099; H03L 7/0991
See application file for complete search history.

(56) References Cited

U.S. PATENT DOCUMENTS

| | | |
|---|---|---|
| 8,570,082 B1 | 10/2013 | Kuo et al. |
| 2003/0227340 A1 | 12/2003 | Koo et al. |

(Continued)

OTHER PUBLICATIONS

International Search Report directed to related International Patent Application No. PCT/EP2021/050746, dated Feb. 19, 2021; 3 pages.

(Continued)

*Primary Examiner* — Patrick O'Neill
(74) *Attorney, Agent, or Firm* — Sterne, Kessler, Goldstein & Fox P.L.L.C.

(57) ABSTRACT

The present disclosure relates to a phase-locked loop (PLL) based on a charge-sharing locking technique, capable of both fractional-N and integer-N operation. The PLL comprises a voltage pre-setting stage; an oscillator: a shared capacitive load; and a switching network configured for selectively connecting the voltage pre-setting stage to the shared capacitive load during a voltage pre-setting stage for applying an expectant voltage to the capacitive load. The switching network is being further configured for selectively connecting the capacitive load to the oscillator during a charge-sharing locking stage for correcting a phase error in response to a difference between the expected voltage of the capacitor and the voltage of the oscillator. Frequency-tracking and waveform-learning stages are also provided for maintaining PVT (process, voltage, temperature) robustness and for suppressing fractional-N spur, respectively.

16 Claims, 18 Drawing Sheets

(56) References Cited

U.S. PATENT DOCUMENTS

| | | |
|---|---|---|
| 2012/0169379 A1 | 7/2012 | Lai et al. |
| 2015/0145570 A1* | 5/2015 | Perrott .................. H03M 3/368 327/159 |
| 2017/0310328 A1 | 10/2017 | Ishibashi |

OTHER PUBLICATIONS

Chun-Ming, H. et al, "A Low-Noise Wide-BW 3.6-GHz Digital ΔΣ Fractional-N Frequency Synthesizer With a Noise-Shaping Time-to-Digital Converter and Quantization Noise Cancellation", IEEE Journal of Solid-State Circuits, IEEE, USA, vol. 43, No. 12, Dec. 1, 2008 (Dec. 1, 2008), pp. 2776-2786.

Wu Y. et al, "A 3.5-6.8GHz wide-bandwidth DTC-assisted fractional-N all-digital PLL with a MASH ΔΣ TDC for low in-band phase noise", IEEE JSSC, Jul. 2017), vol. 52, No. 7, pp. 1885-1903.

Kim J. et al., "A 76fs$_{rms}$ and -40dBc integrated-phase-noise 28-to-31GHz frequency synthesizer based on digital sub-sampling PLL using optimally spaced voltage comparators and background loop-gain optimization", ISSCC, (2019), pp. 258-260.

Deng W. et al., "A 0.048mm2 3mW Synthesizable Fractional-N PLL with a Soft Injection-Locking Technique", IEEE ISSCC, (2015), 31 pages.

* cited by examiner

| Building Blocks | $P_{DC}$ (mW) |
|---|---|
| QDCO ($V_B$=0.5V, $V_{DD}$=0.4V) | 3.92 |
| Harmonic Extractors (HE) ($V_B$=0.7V, $V_{DD}$=1V) | 2×5 |
| R-2R DACs | 2×0.75 |
| SAR-ADC | 0.1 |
| Ref. buf. + Timing logics + Others | 0.82 |
| SPI + Digital | 0.14 |
| Total | 16.5 |

FIG. 13

FRACTIONAL-N FREQUENCY SYNTHESIZER BASED ON A CHARGE-SHARING LOCKING TECHNIQUE

FIELD OF THE INVENTION

The present invention relates to a phase-locked loop (PLL). In particular but not exclusively, the present invention relates to a charge-sharing locking (CSL)-PLL.

BACKGROUND OF THE INVENTION

Generally in wireline, wireless, or optical information transfer systems, low in-band phase noise is necessary for accurate transmission and recovery of information. Jitter, i.e. the deviation of a signal from true periodicity, is a problem ubiquitous in communications systems architecture and design. In high-speed signal conversion, jitter can cause variance in the times between two samples (with respect to a reference clock), thus degrading signal quality. The jitter is related to phase noise or other spurious signal components.

Fifth Generation (5G) cellular network technology, especially in its millimeter-wave (mmW) range (i.e. 28 GHz or 39 GHz), although in the infancy of its public implementation, is expected to find widespread use in the near-future as an alternative to presently available and in-use band frequencies (i.e. of the order of several Gigahertz or less) which face increasing traffic. In particular, millimetre-wave (mmW) frequencies are widely considered to provide a desirable alternative. Thus, addressing the need of a fractional-N synthesizer with low in-band phase noise, low jitter, low fractional-N spur, and low power consumption is of great importance if 5G mmW frequencies are to prove a successful and long-lasting solution in an age where connectivity is set to continually increase.

Traditional all-digital phase-locked loop (ADPLL) suffers from the limited resolution of a digital phase detector, i.e., time-to-digital converter (TDC), which results in limited in-band phase noise performance and jitter, such as in the following article, Y. Wu, M. Shahmohammadi, Y. Chen, P. Lu, and R. B. Staszewski, "A 3.5-6.8 GHz wide-bandwidth DTC-assisted fractional-N all-digital PLL with a MASH $\Delta\Sigma$ TDC for low in-band phase noise," IEEE JSSC, vol. 52, no. 7, pp. 1885-1903, July 2017.

Consequently, sub-sampling (SS) and injection locking (IL) techniques are becoming increasingly popular for 5G mmW frequency generation due to their ability to achieve ultra-low jitter ($<100\times10^{-15}$ s). However, sub-sampling phase-locked loops (SS-PLLs) typically suffer from high-power consumption, especially in the mmW voltage-controlled oscillator (VCO) buffer (isolating the VCO from its sampler for reducing reference spurs) and the high-speed divider. Moreover, the analogue loop filter usually occupies large area. On the other hand, the IL technique in mmW frequency generation requires power-hungry high-frequency injection (the order of Gigahertz) to fully suppress oscillator phase noise and cannot deliver robustness over PVT (process, voltage, temperature), which requires an additional frequency-tracking loop (FTL). Furthermore, there exists a significant danger of a timing-race problem between the injection reference and FTL, since the frequency error may be corrected by injection locking before the FTL senses it. What is more, the conventional injection locking techniques can only implement integer-N PLL, which significantly limit their applications.

To solve the timing-race problem in the IL technique, the FTL based on a phase averaging technique in J. Kim, et al., "A 76 fsrms and −40 dBc integrated-phase-noise 28-to-31 GHz frequency synthesizer based on digital sub-sampling PLL using optimally spaced voltage comparators and background loop gain optimization," ISSCC, pp. 258-259, 2019, was proposed, but it requires a quadrature voltage-controlled oscillator (QVCO) and analogue loop filter with a relatively large area.

To enable the fractional-N operation in the injection locking, dual-VCOs scheme was proposed in W. Deng, et al., "A 0.048 mm2 3 mW Synthesizable Fractional-N PLL with a Soft Injection-Locking Technique", IEEE ISSCC, pp. 252-253, February 2015, where frequency information is monitored by an additional oscillator without any injection applied. However, it is at the cost of double the area and power of oscillator and easily susceptible to any mismatches between two oscillators.

A further challenge in 5G communications is quadrature mmW generation. Directly running the oscillator at mmW frequencies would suffer from low Q-factor of sw-cap banks and possibly serious injection pulling by PA with very wide bandwidth (e.g. 400 MHz for 5G modulation).

It is therefore desirable to provide methods and systems which address at least some of the drawbacks found in the state of the art. In particular, it is desirable to provide methods and PLLs which minimise in-band phase noise without demanding a significant power and which are not limited to integer-N operation.

SUMMARY OF THE INVENTION

According to one aspect of the invention there is provided a phase-locked loop (PLL) for charge-sharing locking; the PLL comprising:
  a voltage pre-setting stage;
  an oscillator;
  a shared capacitive load; and
  a switching network configured for selectively connecting the voltage pre-setting stage to the shared capacitive load during a phase of voltage pre-setting for applying an expectant voltage to the capacitive load; the switching network being further configured for selectively connecting the capacitive load to the oscillator during a phase of charge-sharing locking for correcting a phase error in response to a difference between the expected voltage of the capacitor and the output voltage of the oscillator.

According to a further aspect of the invention there is provided a phase-locked loop, PLL, for charge-sharing locking; the PLL comprising:
  a voltage pre-setting stage;
  an oscillator;
  a shared capacitive load operably coupled between the voltage pre-setting stage and the oscillator; and
  a switching network configured for selectively connecting the voltage pre-setting stage to the shared capacitive load during a phase of voltage pre-setting for applying an expectant voltage to the capacitive load, wherein the expectant voltage is pre-set on the capacitive load based on an expected output voltage of the oscillator; the switching network being further configured for selectively connecting the capacitive load to the oscillator during a phase of charge-sharing locking for correcting a phase error as a result of a difference between the expected voltage of the capacitive load and the output voltage of the oscillator.

In one aspect the shared capacitive load is operably coupled between the voltage pre-setting stage and the oscillator.

In one aspect the switching network comprises a first switch operable for selectively coupling the voltage pre-setting stage to the shared capacitive load.

In another aspect the switching network comprises a second switch operable for selectively coupling the shared capacitive load to the oscillator.

In a further aspect, the voltage pre-setting stage comprises a digital-to-analogue converter (DAC).

In an exemplary aspect, the voltage pre-setting stage further comprises a digital block for providing a discrete and aliased sinusoidal waveform to an input of the DAC for fractional-N operation. In another aspect the voltage pre-setting stage further comprises a digital block for providing a discrete and constant waveform to an input of the DAC for integer-N operation.

Advantageously, a frequency tracking loop is provided between the shared capacitive load and a digitally controlled oscillator (DCO). Preferably, an output of the DAC is operably coupled to the shared capacitive load via the first switch.

In a further aspect, the oscillator comprises one of: an LC oscillator, a ring oscillator, a quadrature oscillator, a relaxation oscillator, a triangle waveform oscillator, or rotary travelling-wave oscillator (RTWO).

In an exemplary aspect, the frequency tracking loop is configured to sample a charge residue of the capacitor load. Advantageously, the frequency tracking loop comprises an analogue-to-digital convertor, ADC, an infinite impulse response filter and a digital integrator.

In another aspect, the oscillator may comprise at least one harmonic extractor for supporting 5G mmW frequency (e.g. 28 GHz or 39 GHz).

According to another aspect of the invention there is provided a method of charge-sharing locking for use in a PLL; the method comprising:
  providing a voltage pre-setting stage;
  providing an oscillator;
  providing a shared capacitive load;
  selectively connecting the voltage pre-setting stage to the shared capacitive load during a first phase for applying an expectant voltage to the capacitive load; and
  selectively connecting the capacitive load to the oscillator for phase error correction during a second phase in response to a voltage difference between the expected voltage of the capacitor and the voltage of the oscillator.

According to a further aspect of the invention there is provided a method of charge-sharing locking for use in a PLL; the method comprising:
  providing a voltage pre-setting stage;
  providing an oscillator;
  providing a shared capacitive load operably coupled between the voltage pre-setting stage and the oscillator;
  selectively connecting the voltage pre-setting stage to the shared capacitive load during a first phase for applying an expectant voltage to the capacitive load, wherein the expectant voltage is pre-set on the capacitive load based on an expected output voltage of the oscillator; and
  selectively connecting the capacitive load to the oscillator for phase error correction during a second phase in response to a voltage difference between the expected voltage of the capacitor and the voltage of the oscillator.

In one aspect, the method comprises sampling a charge residue of the shared capacitive load using a frequency tracking loop.

In another aspect, the method comprises utilising a waveform-learning algorithm for learning the waveform of the oscillator.

According to a third aspect of the invention there is provided an apparatus suitable for use in a communications network or a radar system; the apparatus comprising a PLL including:
  a voltage pre-setting stage;
  an oscillator:
  a shared capacitive load;
  a switching network configured for selectively connecting the voltage pre-setting stage to the shared capacitive load during a phase of voltage pre-setting for applying an expectant voltage to the capacitive load; the switching network being further configured for selectively connecting the capacitive load to the oscillator during a phase of charge-sharing locking for correcting a phase error in response to a difference between the expected voltage of the capacitor and the voltage of the oscillator.

BRIEF DESCRIPTION OF THE DRAWINGS

FIG. 13 is a tabulated power breakdown of building blocks of an exemplary CSL-QPLL, consistent with embodiments of the present disclosure.

DETAILED DESCRIPTION OF THE DRAWINGS

The present teaching will now be described with reference to an exemplary PLL, and additionally an exemplary phase locking technique which will be referred to herein as a 'Charge-Sharing Locking' (CSL) technique. It will be understood that the exemplary CSL technique are provided to assist in an understanding of the present teaching and are not to be construed as limiting in any fashion. Furthermore, elements or components that are described with reference to any one Figure may be interchanged with those of other Figures or other equivalent elements without departing from the spirit of the present teaching.

Figure 1A:
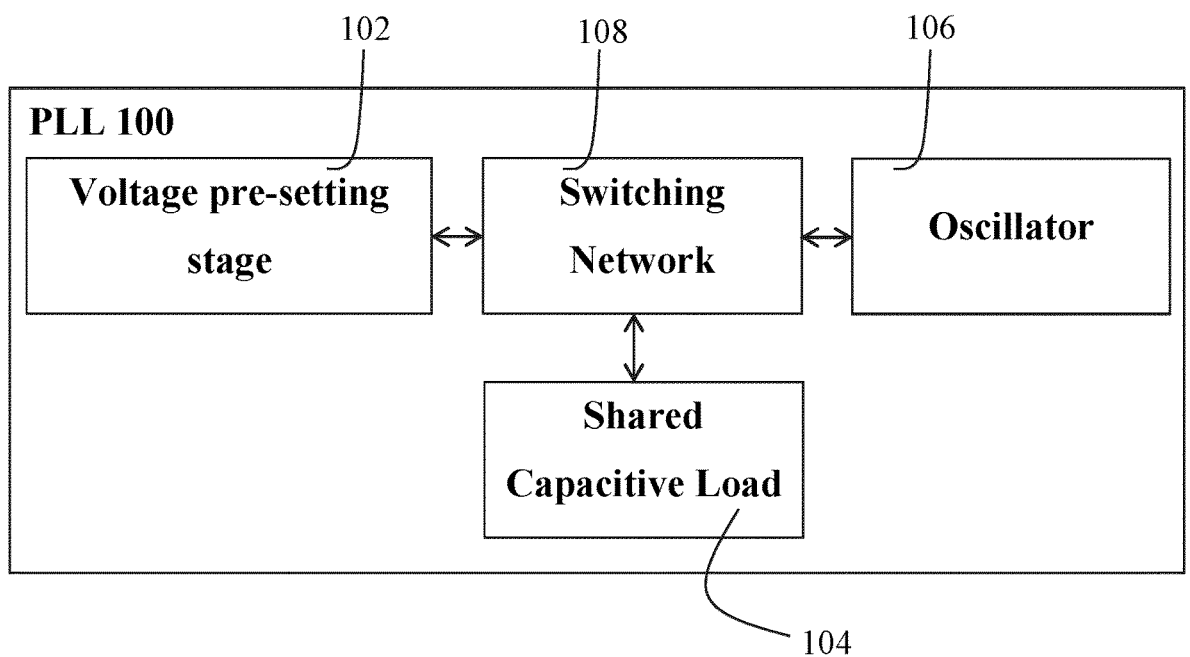
FIG. 1A is a block diagram of an exemplary phase-locked loop (PLL) based on a charge-sharing locking technique in accordance with the present teaching.
Figure 1B:
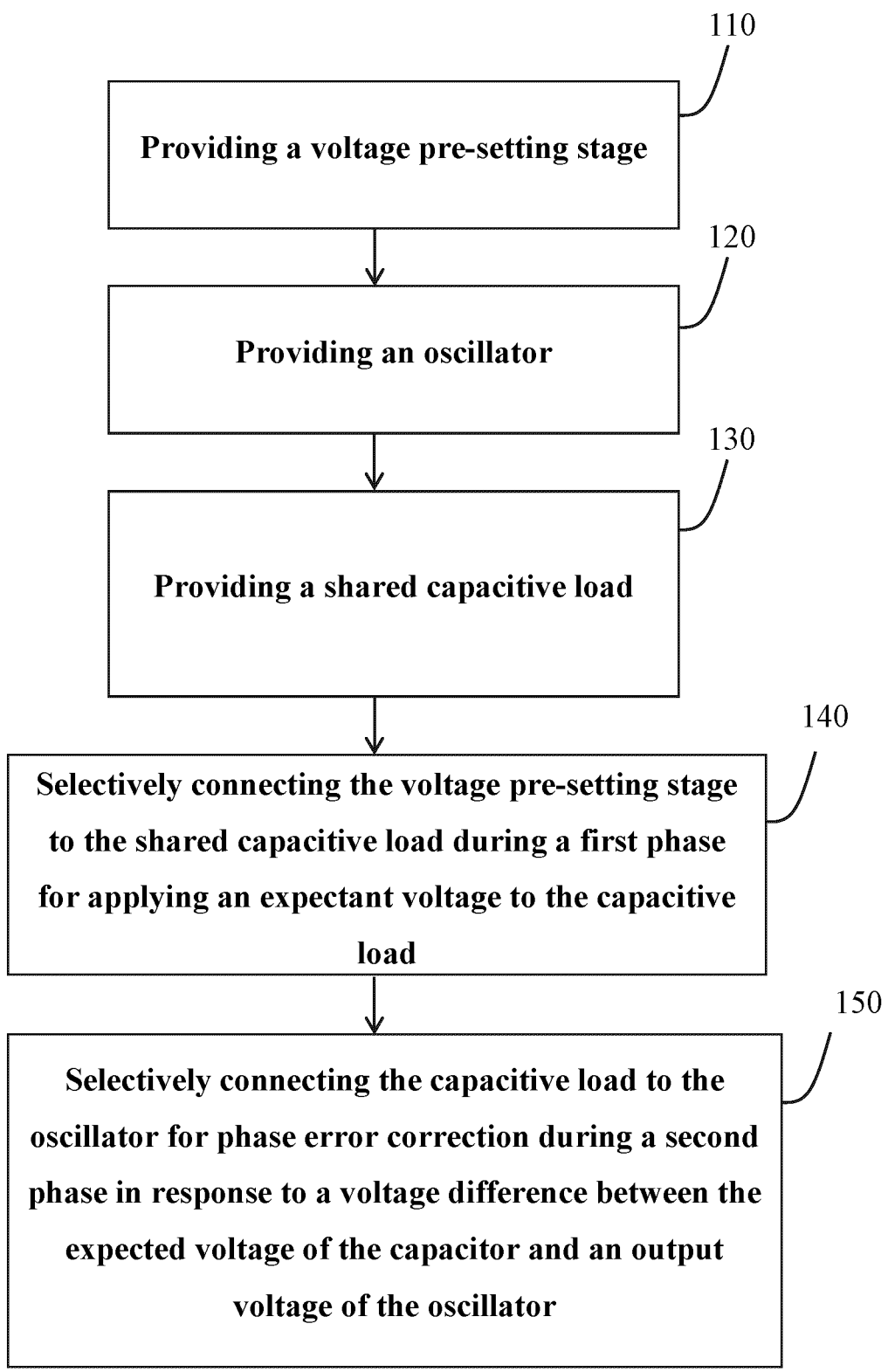
FIG. 1B is a flow chart illustrating exemplary steps of a charge-sharing locking (CSL) technique implemented by the PLL of FIG. 1A and is also in accordance with the present teaching.

Referring now to FIG. 1A there is illustrated a schematic diagram of an exemplary phase lock loop (PLL) 100 based on a charge-sharing locking (CSL) technique. In the exemplary embodiment the PLL 100 may comprise a voltage pre-setting stage 102, a shared capacitive load 104, an oscillator 106 and a switching network 108. Referring now to FIG. 1B, there is illustrated a flow diagram detailing steps of an exemplary CSL technique. The CSL technique may comprise providing a voltage pre-setting stage 102, step 110; providing an oscillator 106, step 120; providing a shared capacitive load 104, step 130; selectively connecting the voltage pre-setting stage 102 to the shared capacitive load 104 during a phase of voltage preset for applying an expectant voltage to the capacitive load 104, step 140; and selectively connecting the capacitive load 104 to the oscillator 106 for phase error correction during a second phase of charge-sharing locking in response to a voltage difference between the expected voltage of the capacitive load 104 and an output voltage of the oscillator 106, step 150.

Figure 2:
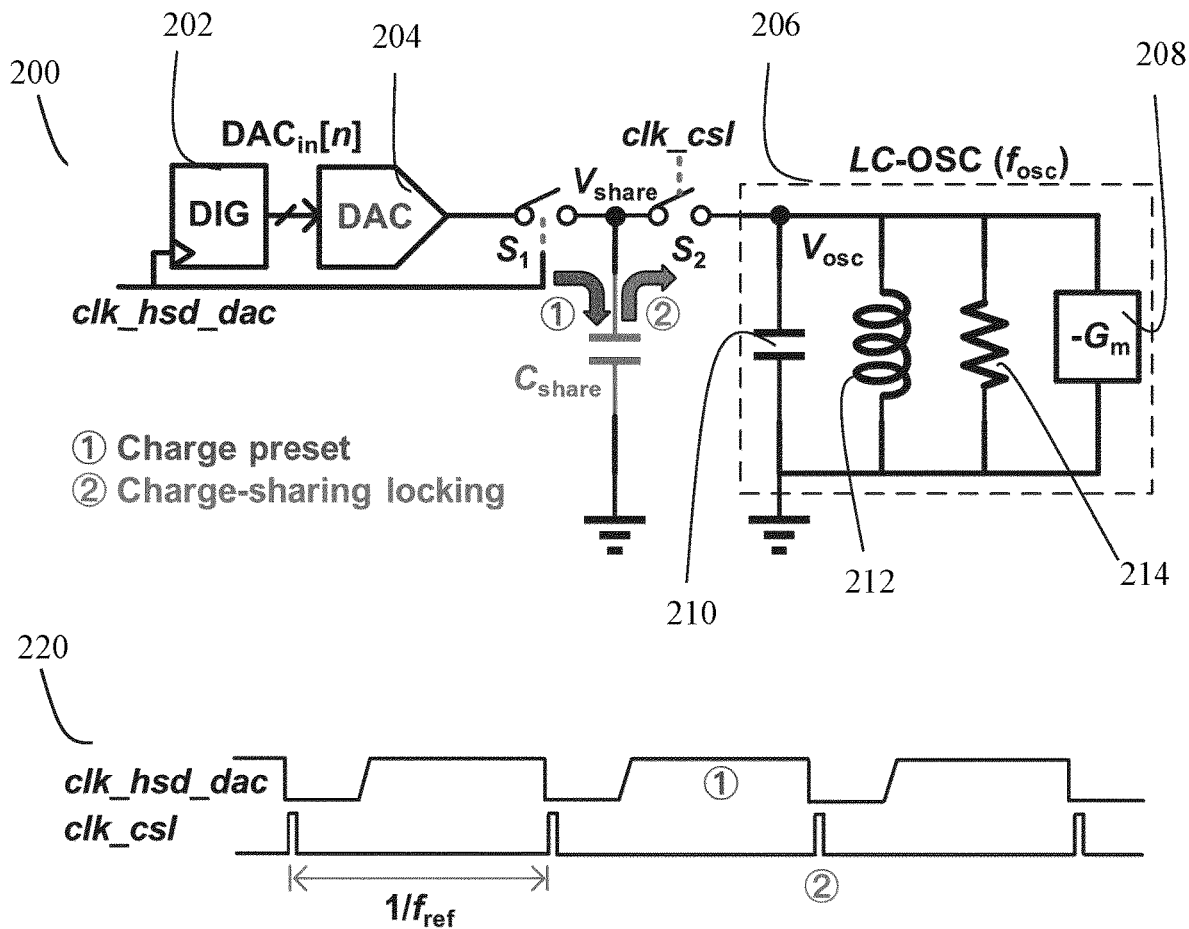
FIG. 2 is a schematic diagram of the PLL of FIG. 1A, and an exemplary timing diagram.
Figure 4:
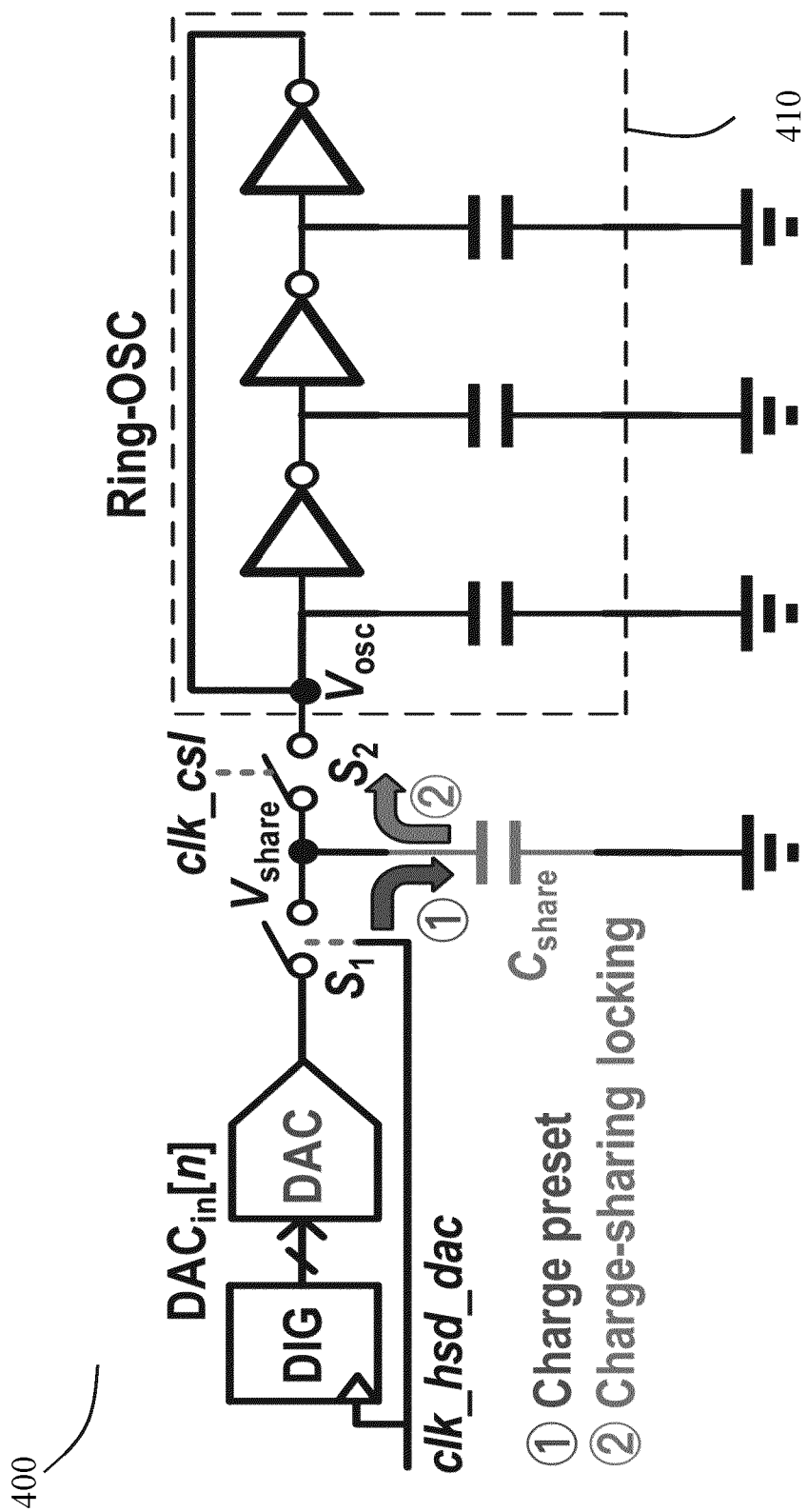
FIG. 4 is a schematic diagram of another PLL which uses a ring oscillator which is also in accordance with the present teaching.

Referring now to FIG. 2 there is illustrated a schematic diagram of an exemplary phase lock loop (PLL) 200 based on a charge-sharing locking (CSL) technique, and a corresponding exemplary timing diagram 220. In the exemplary embodiment the voltage pre-setting stage 102 comprises a digital block (DIG) 202 and a digital-to-analogue converter (DAC) 204. In the exemplary embodiment the oscillator 106 comprises an LC oscillator 206. It will be appreciated by those skilled in the art that the exemplary CSL technique can be applied to any type of oscillator, for example, a ring oscillator as illustrated in FIG. 4. The LC oscillator 206 is provided by way of example only and it is not intended to limit the present disclosure to the exemplary oscillator of FIG. 2. In the exemplary embodiment the switching network 108 comprises RF switches $S_1$ and $S_2$ which are selectively controlled by timing-control signals clk_hsd_dac and clk_csl, respectively. In the exemplary embodiment the shared capacitive load 104 comprises a sharing capacitor ($C_{share}$). In the exemplary embodiment the sharing capacitor $C_{share}$ comprises a capacitance of approximately $1 \times 10^{-12} s^2 A^2 m^{-2} kg^{-1}$. In various embodiments the sharing capacitor $C_{share}$ may comprise a capacitance in the approximate range of $1 \times 10^{-12} s^2 A^2 m^{-2} kg^{-1}$ and $10 \times 10^{-12} s^2 A^2 m^{-2} kg^{-1}$. The LC oscillator 206 is represented by a negative transconductor -Gm 208 and an RLC-tank comprising a capacitor 210, an inductor 212 and an equivalent resistor 214 in parallel. In contrast with the conventional LC-tank-shorting switch for sub-harmonic injection locking (IL) (only supporting integer-N operation), the sharing capacitor $C_{share}$ of the present teaching with the DAC-controlled preset voltage enables fractional-N charge-sharing locking. As illustrated in the timing diagram 220, at the rising edge of clk_hsd_dac, the DIG 202 may update the input of DAC 204 ($DAC_{in}[n]$), while during the high-level of clk_hsd_dac, the DAC 204 may preset an expected voltage $V_{share}$ on $C_{share}$ by turning on switch $S_1$. Then, after the falling edge of clk_hsd_dac, a short pulse clk_csl (whose repetition period is $1/f_{ref}$) may turn-on the switch $S_2$ connecting $C_{share}$ to the oscillator's tank. If the oscillator's waveform $V_{osc}$ is different from the expected $V_{share}$ (i.e., indicating phase error, which may be caused by intrinsic phase noise of the oscillator and frequency error between the oscillation frequency $f_{osc}$ and N times input reference frequency $N \times f_{ref}$, where N is the divide ratio of PLL (which can be an integer value or a fractional value), then the charge on the $C_{share}$ will be shared with the LC oscillator tank to correct its phase error.

Figure 3:
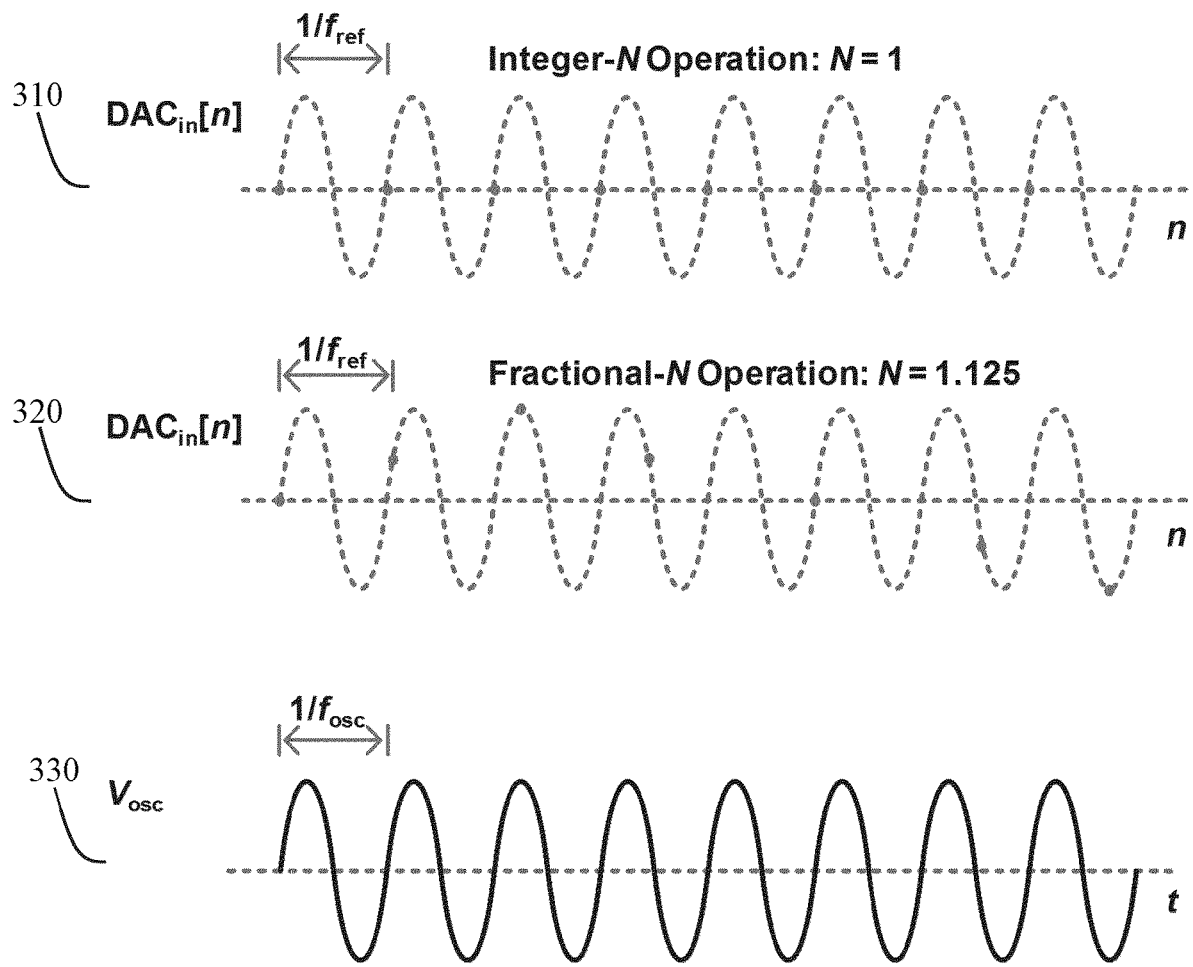
FIG. 3 illustrates exemplary waveform diagrams of a DAC input signal for both integer-N and fractional-N operations of the exemplary charge-sharing locking (CSL) technique, as well as an exemplary waveform diagram of an oscillator, in accordance with the present teaching.

Referring now to FIG. 3 there is illustrated exemplary waveform diagrams showing the DAC 204 input signal ($DAC_{in}[n]$) for both integer-N 310 and fractional-N 320 operations of the exemplary charge-sharing locking (CSL) technique, consistent with embodiments of the present disclosure. For simplicity, in the exemplary arrangement the frequency of the oscillator 206 may be assumed as $f_{osc} \approx N \times f_{ref}$, N=1 for integer-N operation, and N=1.125 for fractional-N operation. FIG. 3 also illustrates the oscillation waveform of $V_{osc}$ with a period of $1/f_{osc}$ 330. In the integer-N operation of CSL, the expected $V_{share}$ generated by DAC 204 will be a discrete and constant voltage (i.e. zero-crossing voltage of $V_{osc}$) throughout as indicated in the waveform 310, while in the fractional-N operation, the DAC input $DAC_{in}[n]$ will be a discrete and aliased sinusoidal waveform of $V_{osc}$ as indicated in the waveform 320. As a result of the combination of the DAC 204 and the sharing capacitor $C_{share}$ generating and storing $V_{share}$, the exemplary CSL technique has an implicit ability of fractional-N operation, which is fundamentally different from conventional sub-harmonic injection locking (IL) based on a shorting switch.

Referring to FIG. 4 there is illustrated an exemplary PLL 400 which is also in accordance with the present teaching and is configured to apply the exemplary CSL technique in a similar fashion to the PLL 100 of the foregoing embodiments, like components are indicated by similar reference numerals. The main difference is that a ring oscillator 410 is used in the PLL 400 while an LC tank oscillator 206 is used in the PLL 200. Otherwise, the operation of the PLL 400 is substantially similar to the PLL 100 and the PLL 200. The teachings of the LC tank oscillator 206 and the ring oscillator 410 are provided by way of example only and are not intended to be limiting in any sense. In alternative embodiments, the oscillator may for example comprise a relaxation oscillator or a rotary travelling-wave oscillator (RTWO).

Figure 5A:
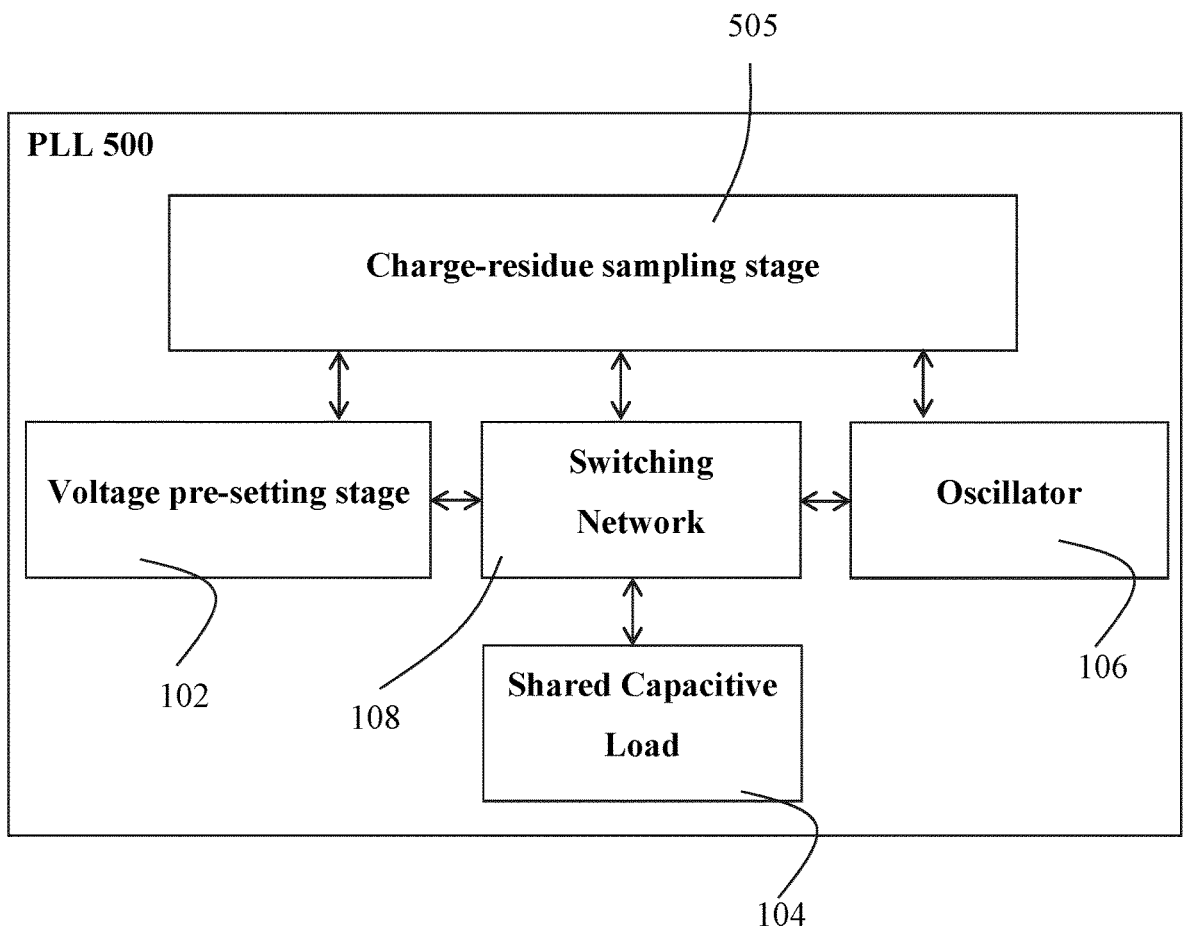
FIG. 5A is a block diagram of another exemplary phase-locked loop (PLL with frequency tracking to maintain robustness of PVT (process, voltage, and temperature) variation) and waveform learning stage (suppressing in-band fractional-N spur) in accordance with the present teaching.
Figure 5B:
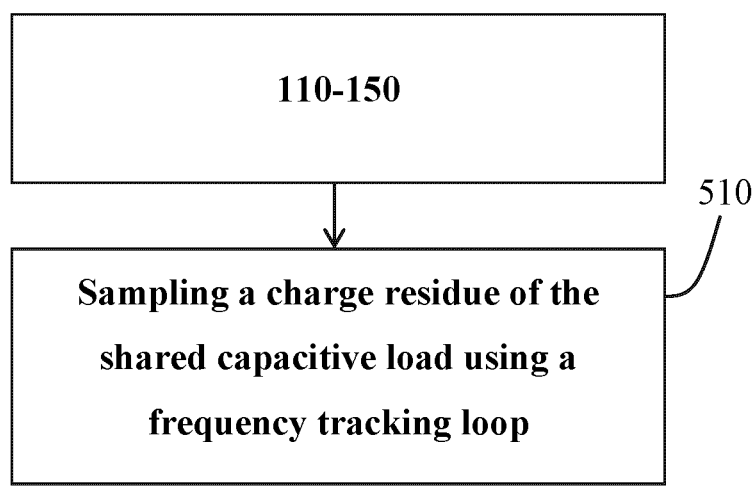
FIG. 5B is a flow chart illustrating an exemplary CSL technique which is also in accordance with the present teaching.
Figure 5C:
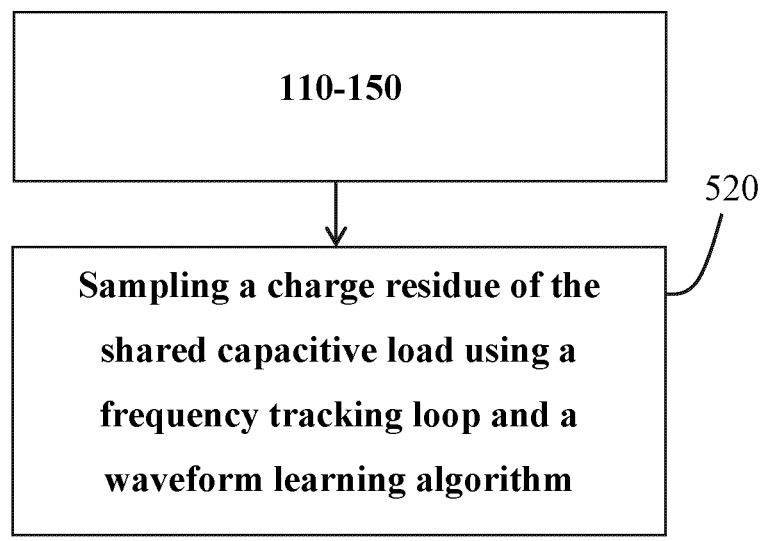
FIG. 5C is a flow chart illustrating an exemplary CSL technique which is also in accordance with the present teaching.

Referring now to FIG. 5A there is illustrated a schematic diagram of an exemplary PLL 500 based on a CSL. The PLL 500 is substantially similar as the PLL 100 and like components are indicated by similar reference numerals, the PLL 500 further comprises a charge-residue sampling stage 505. In the exemplary embodiment the charge-residue sampling stage 505 comprises a frequency tracking loop (FTL) best illustrated in FIG. 6. Advantageously, the FTL may facilitate robustness against PVT variations. In another advantageous embodiment, the charge-residue sampling stage 505 may further comprise a waveform learning algorithm best presented in FIG. 7. Advantageously, the waveform learning algorithm may suppress fractional-N spur. Referring now to FIG. 5B, there is illustrated a flow diagram detailing steps of an exemplary CSL technique. The CSL technique may comprise the CSL method steps 110-150 of FIG. 1B, and may further comprise the step of sampling a charge residue of the shared capacitive load 104 using the FTL, 510, best presented below. FIG. 5C illustrates a flow diagram detailing steps of an exemplary CSL technique. The CSL technique may comprise the CSL method steps 110-150 of FIG. 1B, and may further comprise the step of sampling a charge residue of the shared capacitive load 104 using the FTL and the waveform learning algorithm, 520, best presented below.

Figure 6:
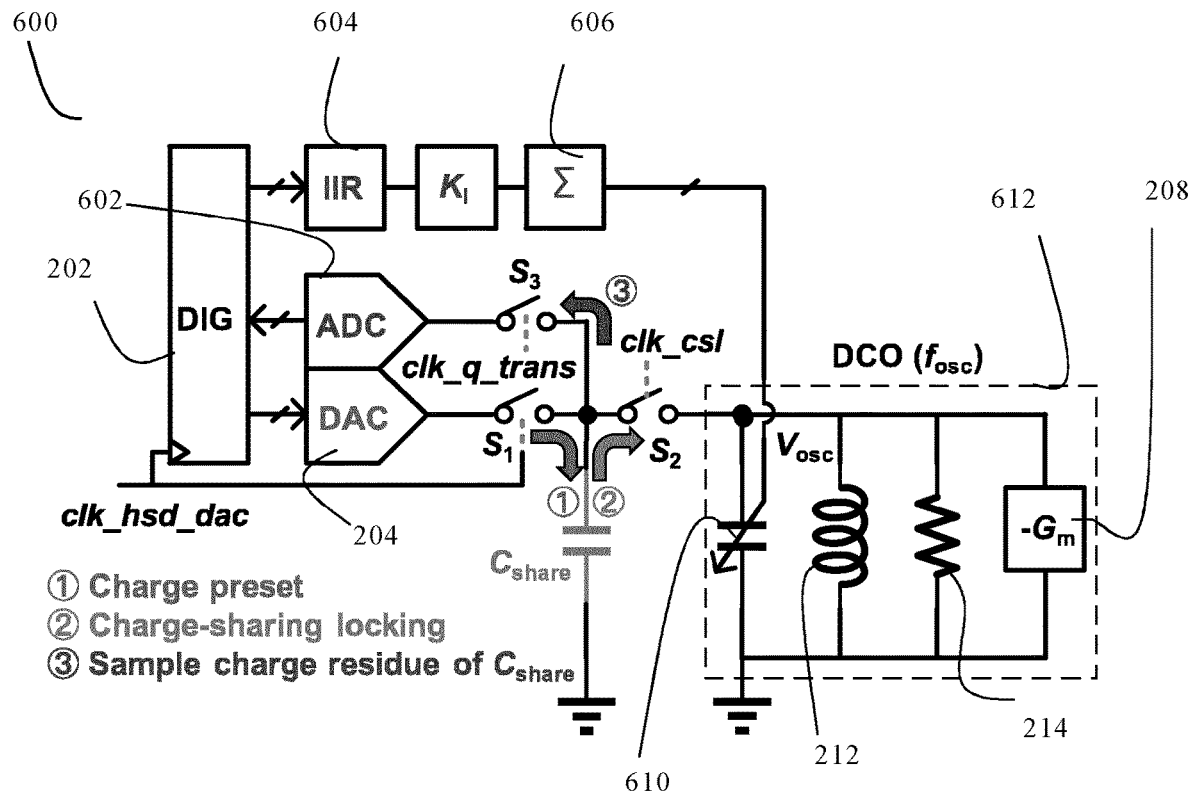
FIG. 6 is a schematic diagram of an exemplary fractional-N charge-sharing locking PLL (CSL-PLL) with a digital frequency tracking loop (FTL), consistent with embodiments of the present disclosure.
Figure 6:
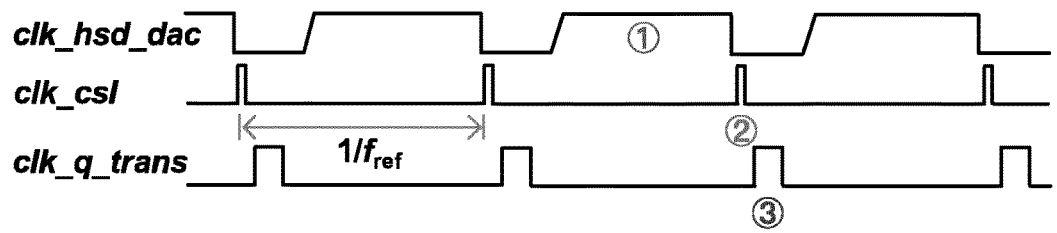

Referring to FIG. 6 there is illustrated a PLL 600 which is also in accordance with the present teaching and is configured to applying the CSL technique in a similar fashion to the PLL 500 of FIG. 5, like components are indicated by similar reference numerals. The PLL 600 may comprise a digital frequency tracking loop (FTL) which is provided to enhance the PVT (process, voltage, temperature) robustness of CSL-PLL. In addition to switches $S_1$ and $S_2$, the switching network of the PLL 600 may comprise a third switch $S_3$ which is controlled by timing-control signal clk_q_trans. In the exemplary embodiment the FTL comprises an analogue-to-digital convertor (ADC) 602, a digital infinite impulse response (IIR) filter 604, an accumulator E 606, and an attenuation ratio $K_1$. The output of the FTL may control a switched capacitor bank (sw-cap) 610 of a digitally controlled oscillator (DCO) 612. After each CSL event (proportional path, phase correction), $S_3$ may be closed by the timing-control signal clk_q_trans and the charge residue on $C_{share}$ (mainly representing frequency error between $f_{osc}$ and $N \times f_{ref}$) may be transferred and processed by the digital FTL to eliminate frequency error (integral path, frequency tracking).

The exemplary CSL technique offers the following advantages. As a result of the $C_{share}$ capacitor recording how much charge was used to correct the phase error (caused by frequency error and intrinsic DCO phase noise), the timing-race problem existing between conventional injection locking and its FTL can be effectively mitigated. The ADC-based digital FTL may consume ultra-low power and occupy a small area. In certain embodiments the ADC-based digital FTL may occupy an area less than 0.002 mm² The fine switched-capacitor (sw-cap) tuning bank in the DCO may be used for frequency tracking exclusively (rather than the phase correction in ADPLL or digital sub-sampling PLL), thus relieving the requirements on the resolution (usually requiring a high-speed ΔΣ modulator) and the linearity of the sw-cap.

Figure 7:
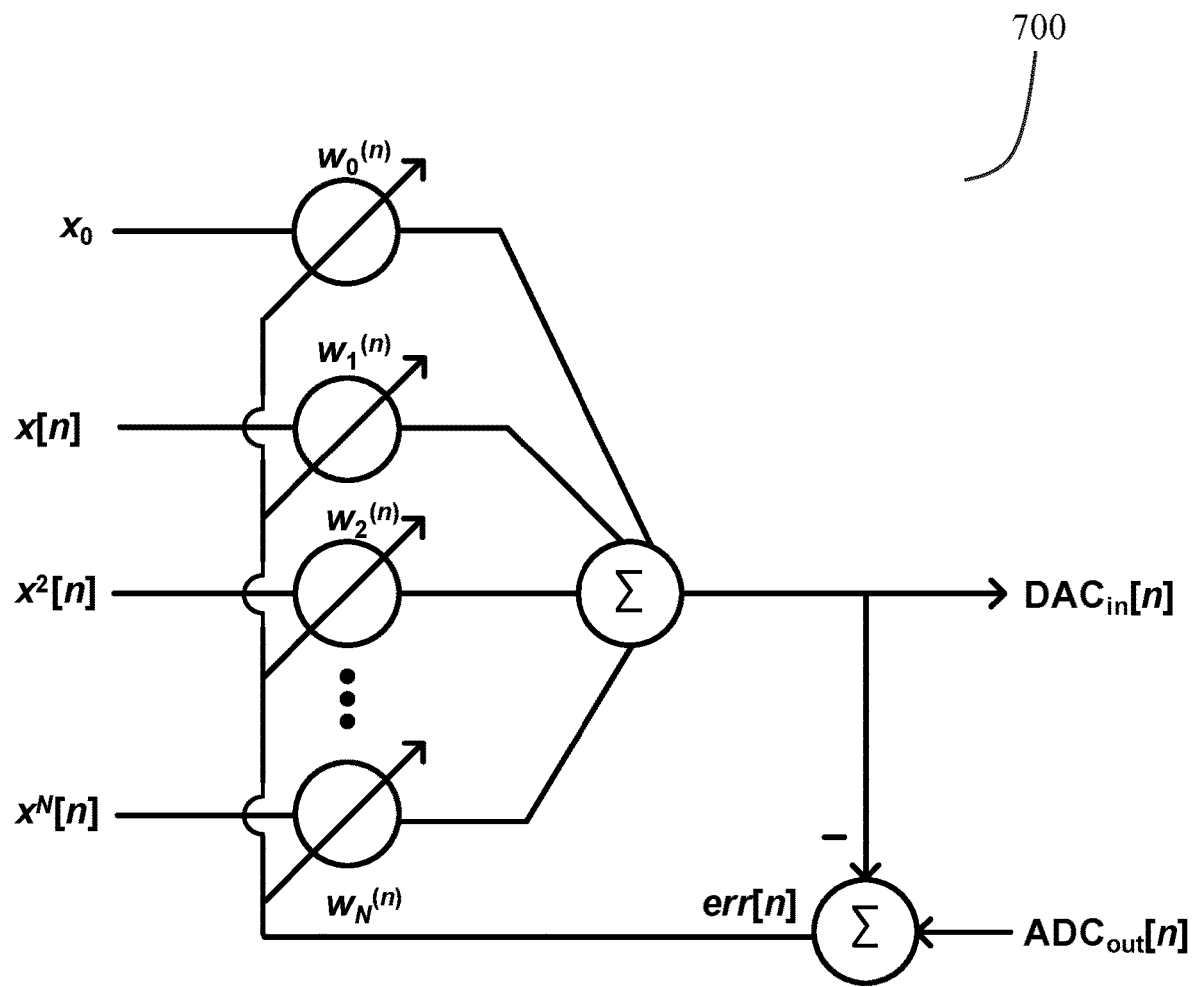
FIG. 7 is a diagram of a waveform-learning algorithm in charge-sharing locking (CSL) PLL suppressing fractional-N spur, consistent with embodiments of the present disclosure.

Referring to FIG. 7, there is provided a conceptual diagram of a waveform-learning algorithm, which may be implemented in the DIG block 202 in FIG. 6, and configured for learning the waveform of the oscillator. The waveform learning algorithm may be used for suppressing fractional-N spur. Suppressing the fractional-N spur is beneficial to meet the demanding requirements of any advanced communication standard. In the CSL-PLL, the fractional-N spur is mainly caused by gain mismatch between the oscillation waveform $V_{osc}$ and the charge-shared waveform $V_{share}$. First of all, assume $V_{osc}$ is a purely sinusoidal waveform, thus the input pattern x[n] should also be an aliased sinusoidal pattern (see FIG. 3), which is then multiplied by weight $w_1^{(n)}$ to control the DAC for fractional-N charge-sharing locking After CSL and frequency tracking, the mean of err[n] (i.e. the error between the ADC output $ADC_{out}$[n] and the DAC input $DAC_{in}$[n]) will be zero, but its standard deviation (representing the fractional-N spur) could be large if the weight $w_1^{(n)}$ is not well-matched with the actual $V_{osc}$. Further, the fractional spur could be even worse if the $V_{osc}$ includes other, higher, harmonics, if the input pattern x[n] only includes the fundamental sinusoidal waveform. To solve the fractional-N spur problem in the CSL-PLL, the exemplary waveform learning algorithm is provided based on polynomial curve fitting and least mean square (LMS) principle. The input pattern may include higher order terms of x[n] (e.g. $x_0$, x[n], $x^2$[n], $x^3$[n], . . . , $x^N$[n]), while their corresponding weights (e.g. $w_0^{(n)}, w_1^{(n)}, w_1^{(n)}, \ldots, w_N^{(n)}$) may be tuned by the LMS principle. Thus, the exemplary CSL-PLL may learn the waveform of $V_{osc}$ to generate well-matched $V_{share}$, suppressing the fractional-N spur.

Figure 8:
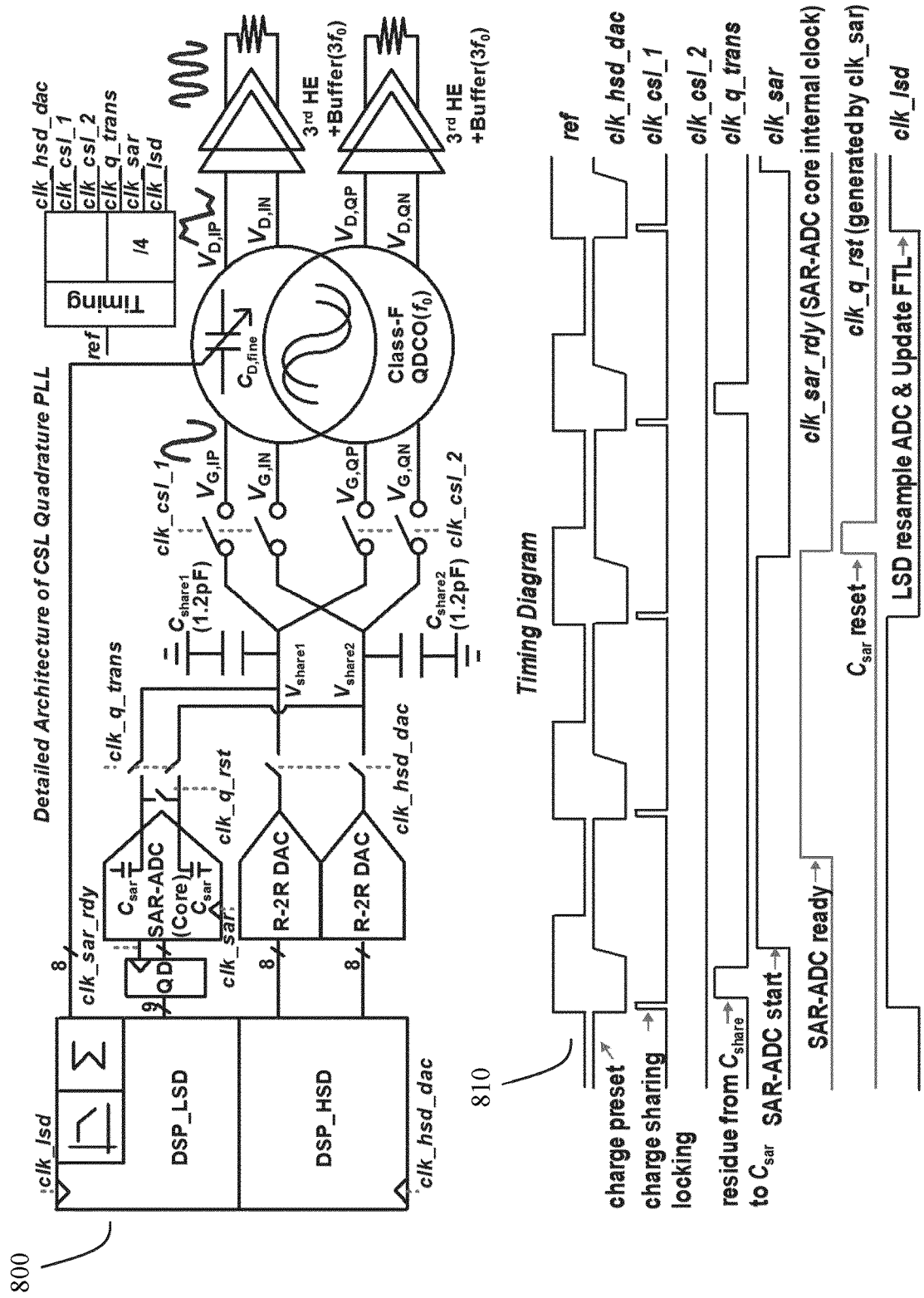
FIG. 8 provides illustrations of a detailed architecture of an exemplary charge-sharing locking quadrature PLL (CSL-QPLL) and its timing diagram, consistent with embodiments of the present disclosure.

Referring to FIG. 8 there is illustrated a charge-sharing locking quadrature PLL (CSL-QPLL) 800 and its timing diagram 810. To demonstrate the basic principle of CSL technique, the present inventors designed and fabricated a charge-sharing locking quadrature PLL (CSL-QPLL) for 5G mmW application using TSMC 28 nm technology. FIG. 8 shows the detailed architecture of the CSL quadrature frequency synthesizer for 5G mmW communications. The charge-sharing switches (controlled by clk_csl_1/2) employ an improved bootstrap technique, while the other switches are based on plain transmission gates. Four drain nodes ($V_{D,IP/IN/QP/QN}$) of QDCO with quasi-square-wave are fed for harmonic extraction, while the charge-sharing locking happens at its gate nodes ($V_{G,IP/IN/QP/QN}$ with sinusoidal waveforms). To further reduce the power, the SAR-ADC-based FTL runs at one quarter of the frequency of reference (involving timing control signals of clk_q_trans, clk_sar, and clk_lsd). The full timing diagram 810 is at the bottom of FIG. 8, where all timing control signals are generated by the reference clock (ref). The rising edge of clk_hsd_dac updates the DAC input, while during their high level the DACs preset the expected $V_{share1/2}$ on $C_{share1/2}$. While assuming that the sharing switches controlled by clk_csl_2 are fully OFF, clk_csl_1 asserts at around the rising edge of $V_{G,IP}$, and the $V_{share1/2}$ is preset to the dc offset of $V_{G,IP/IN}$ (i.e. $V_B$ of DCO (0.5V)). The reason for these assumptions will be explained later. After the falling edge of clk_hsd_dac, a ~15 ps pulse of clk_csl_1 will connect $C_{share1}$ ($C_{share2}$) to $V_{G,IP}$ ($V_{G,IN}$) for charge-sharing locking.

Figure 9:
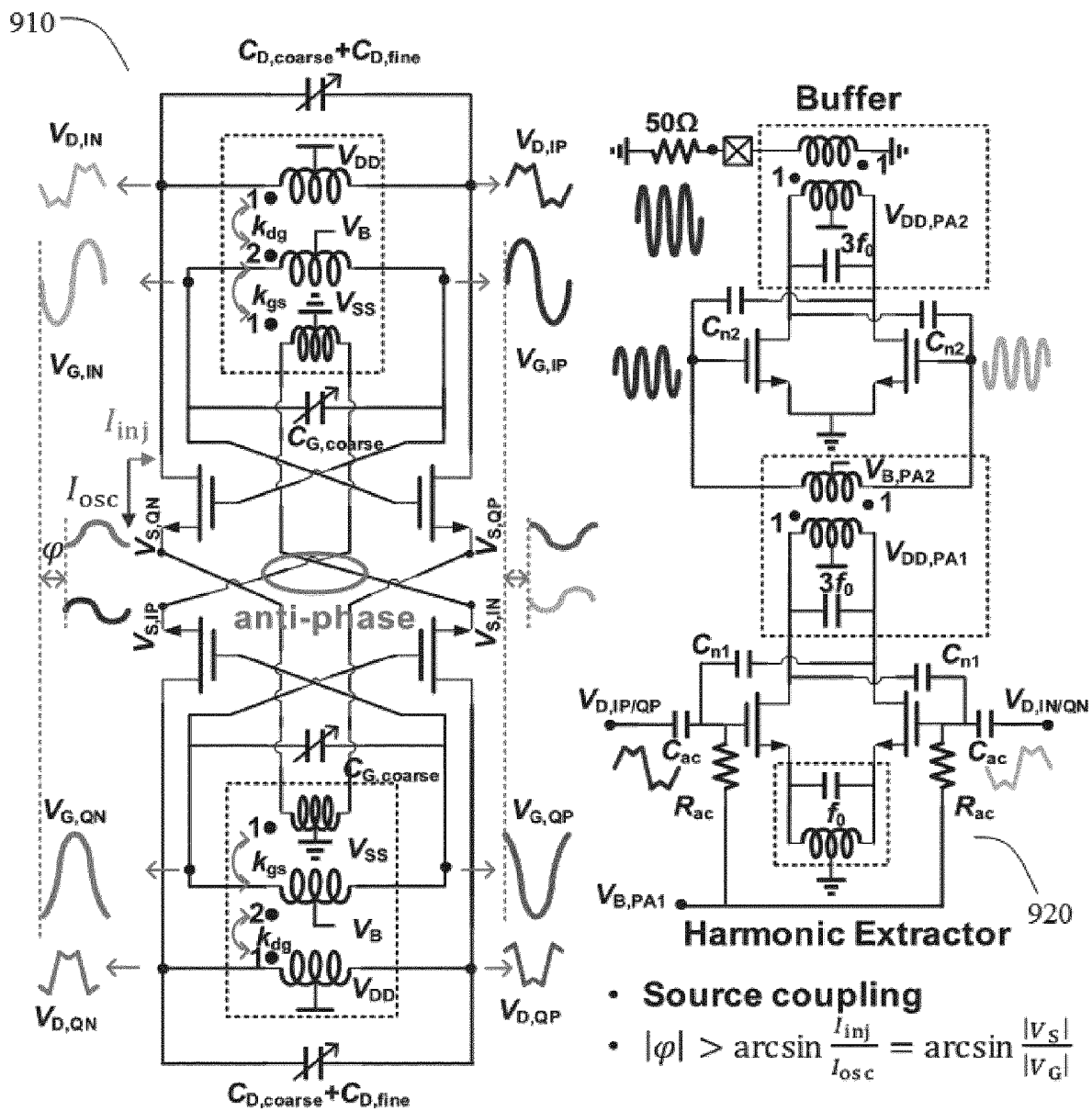
FIG. 9 provides a circuit diagram for an exemplary 5G mmW frequency quadrature generation with a quadrature class-F oscillator and a 3rd harmonic extractor, consistent with embodiments of the present disclosure.
Figure 10:
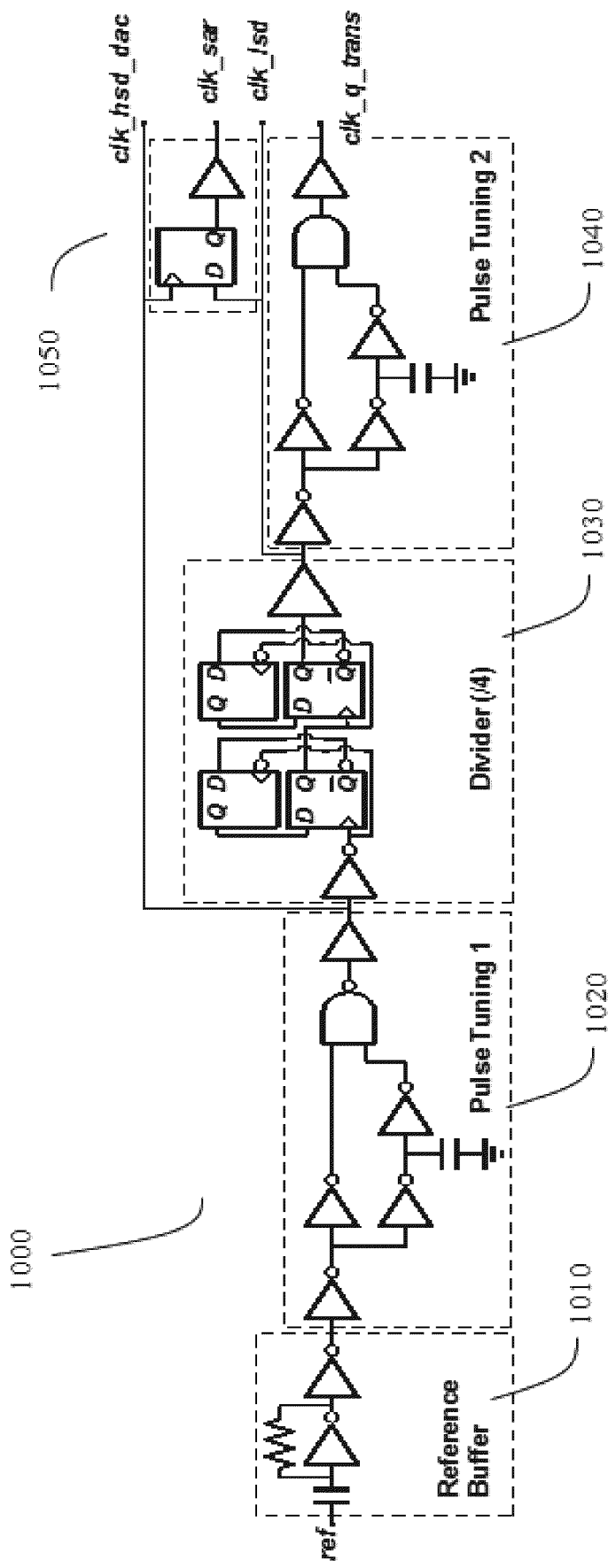
FIG. 10 is an illustration of a timing-control circuitry of an exemplary CSL-QPLL, consistent with embodiments of the present disclosure.
Figure 11:
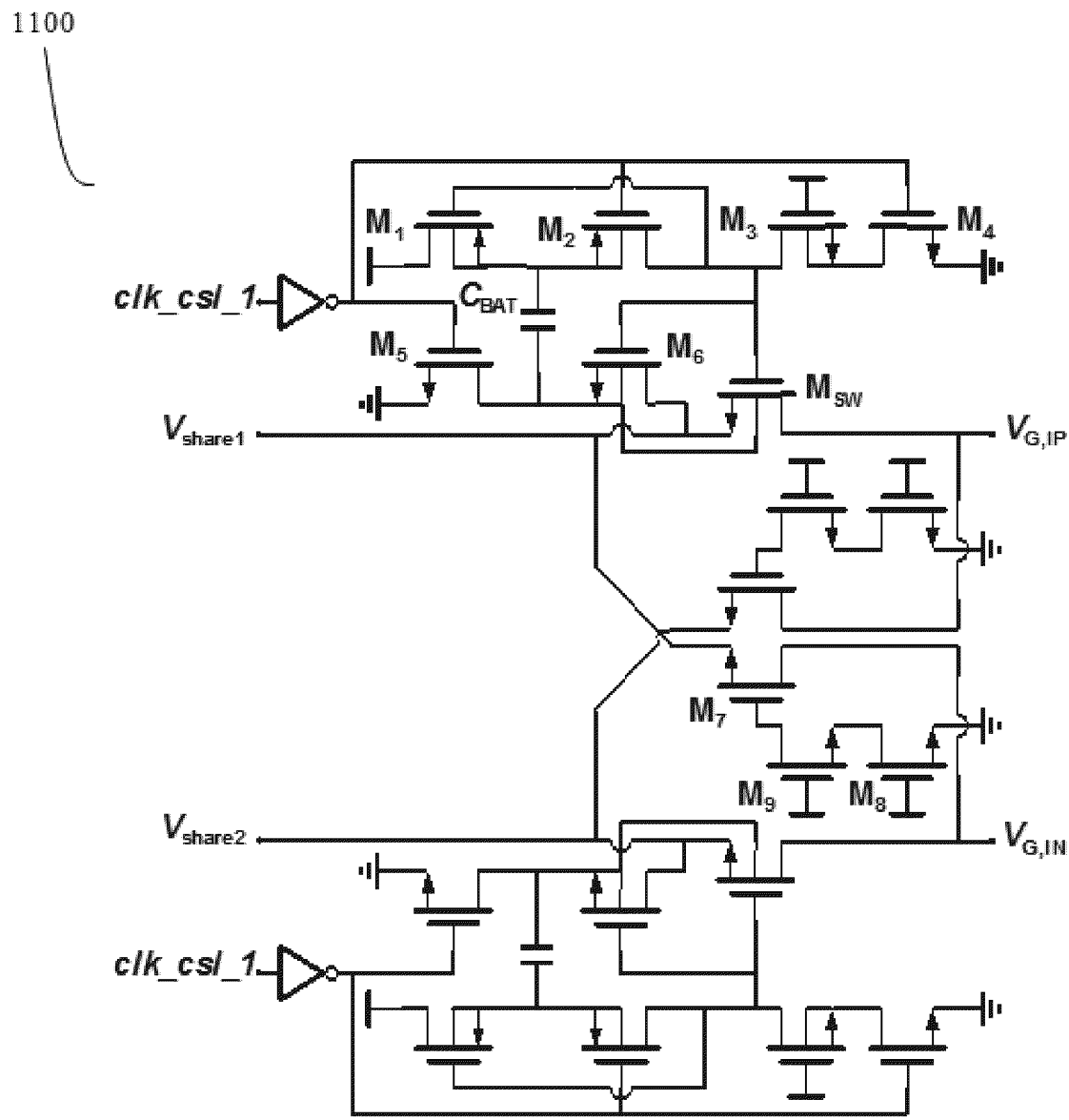
FIG. 11 is an illustration of an exemplary bootstrap switch for CSL with adaptive body biasing, consistent with embodiments of the present disclosure.

Referring to FIG. 9 there is illustrated an exemplary circuit diagram of a 5G mmW frequency quadrature generation with quadrature class-F oscillator 910 and 3$^{rd}$ harmonic extractors 920. FIGS. 9, 10 and 11 show the other key building blocks of the CSL-QPLL 800, including quadrature class-F DCO, timing-control circuits, and improved bootstrap switch, respectively. Quadrature mmW generation is another challenge for 5G communications. Directly running the oscillator at mmW frequencies would suffer from low-Q of sw-cap banks and possible serious injection pulling by a PA with very wide bandwidth (e.g. 400 MHz for 5G modulation). In the exemplary CSL-QPLL 800, the present inventors introduce a quadrature 3rd harmonic extraction based on a source-coupling quadrature class-F oscillator, as shown in FIG. 9. The quadrature oscillator runs at the fundamental frequency (e.g. 8.75 GHz), whose drain-nodes with strong $3^{rd}$ harmonic (~30%) may be extracted by two harmonic extractors (HE). The drain-tank of HE may amplify the $3^{rd}$ harmonic and suppress the fundamental, while its differential tail-tank is to further block the fundamental frequency. The coupling phase delay ($\varphi$) and coupling strength ($I_{inj}/I_{osc}$) are carefully designed to avoid the well-known quadrature uncertainty (+90° or –90°).

FIG. 10 illustrates timing-control circuitry 1000 of the exemplary CSL-QPLL 800 which includes a reference buffer 1010, pulse tuning 1 (generating clk_hsd_dac) 1020, a divider (generating clk_lsd) 1030, pulse tuning 2 (generating clk_q_trans) 1040, and a flip-flop (generating clk_sar) 1050.

FIG. 11 shows the detailed architecture of an exemplary improved bootstrap switch 1100 with an adaptive body biasing technique for the exemplary CSL-QPLL 800. Different from conventional bootstrap switches with constant body biasing, the body of the main switch ($M_{SW}$) is connected to GND when the $M_{SW}$ is OFF for high off-resistance, while it is connected to the source of $M_{SW}$ when the $M_{SW}$ is ON for low on-resistance and good linearity. Since the bootstrap switch is up-down symmetric, the upper part for the analysis is only discussed. During the low-level of clk_csl_1, the M2, M6 are OFF, while the M3, M4 are ON, resulting in $M_{SW}$ turning-off. Also, the M5, M1 are ON to pre-charging the capacitor $C_{BAT}$ to $V_{DD}$. Due to the M5 ON, the body of $M_{SW}$ is connected to the ground (GND). On the other hand, during the high-level of clk_csl_1, M1, M5, M3, and M4 are OFF, while M2 and M6 are ON, connecting $C_{BAT}$ to the gate-source of $M_{SW}$ (turning-on $M_{SW}$ for charge-sharing locking). At the same time, the body of $M_{SW}$ will connect to the source of $M_{SW}$ through M6 to eliminating body-effect of $M_{SW}$. The M7, M8, M9 work as dummy transistors to cancel the hold-up feedthrough from $V_{G,IP}$ to $V_{share1}$.

Figure 12:
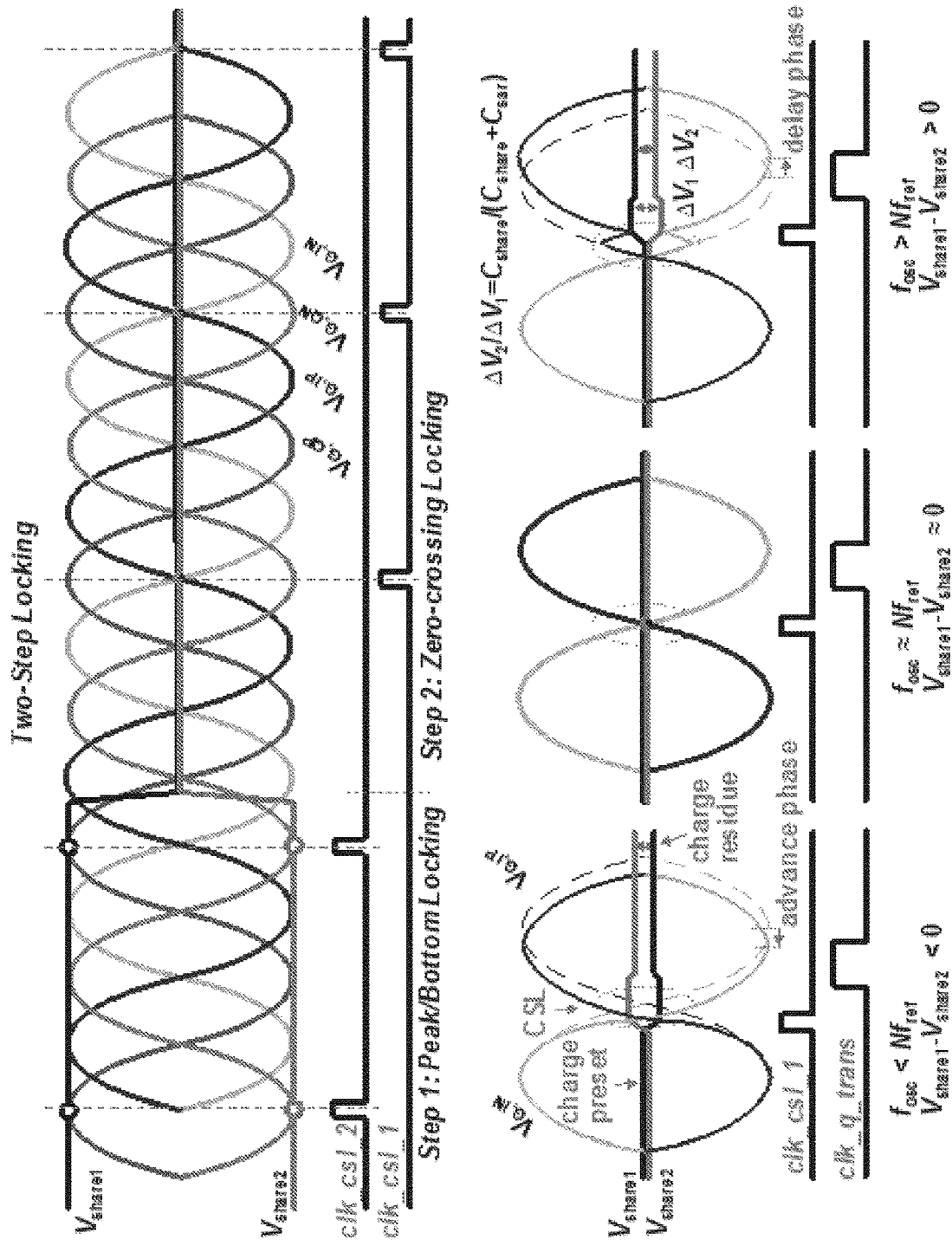
FIG. 12 is an illustration of an exemplary two-step locking method, consistent with embodiments of the present disclosure.

FIG. 12 illustrates an exemplary integer-N operation of the CSL-QPLL 800. If the DCO free-running frequency $f_{osc}$ is lower than $N \times f_{ref}$, the sharing charge advances the phase of DCO, substantially correcting the phase error (caused by the frequency error and phase noise), leaving a differential negative charge residue $\Delta V_1$ ($=V_{share1}-V_{share2}$). If $f_{osc} > N \times f_{ref}$, the sharing charge delays the phase of the DCO, leaving a positive $\Delta V_1$. If $f_{osc} \approx N \times f_{ref}$, the sharing charge is only used to correct zero-mean phase noise, causing $\Delta V_1 \approx 0$. Thus, the polarity and the magnitude of charge residue on $C_{share}$ represent the frequency error between $f_{osc}$ and $N \times f_{ref}$. During the high level of clk_q_trans, the charge residue may be transferred from $C_{share}$ to $C_{sar}$ (the single-ended input capacitance of SAR-ADC). The $\Delta V_2$ sampled by ADC may equal $C_{share}/(C_{share}+C_{sar})\Delta V_1$, which may then be used for tuning the fine capacitor bank of the DCO, facilitating elimination or substantial mitigation of the frequency error. After the falling edge of clk_sar (clk_sar is the start signal of SAR-ADC), $C_{sar}$ with charge residue of $\Delta V_2$ may be reset to 0 by clk_q_rst, waiting for the next charge transfer from $C_{share}$.

Referring to the earlier assumption of locking at the rising edge of $V_{G,IP}$, the conventional sub-sampling loop or the FTL in IL may all assume it is locked at the rising edge (positive slope) or falling edge (negative slope) of oscillation waveform. However, the initial sampling or injection might appear at the other edge rather than the assumed edge, resulting in positive feedback and unlock, even though $f_{osc}$ could be very close to $N \times f_{ref}$. To solve this locking uncertainty, a "two-step locking" is provided in the exemplary CSL. The sharing switch controlled by clk_csl_1 may be fully turned off in step 1, while $C_{share1}$ and $C_{share2}$ are pre-set to the peak (e.g. 1V) and the bottom (0V) of the single-ended $V_{G,QP}$ and $V_{G,QN}$, respectively. They are then charge-shared-locked with the tank by clk_csl_2 (called "peak-bottom locking"). Thus, the rising edge of $V_{G,IP}$ will be tuned to align with the pulse of clk_csl_1/2. After ~0.5 μs (controlled by a counter), step 2, called "zero-crossing locking", may start. The two-step locking may entirely avoid the two false-locking points in conventional IL and SS techniques, thus solving the locking uncertainty.

Referring to FIG. 13, there is a provided a power breakdown of building blocks of the exemplary CSL-QPLL, consistent with embodiments of the present disclosure. The reference buffer and timing control circuit (operating at 1V) consume 0.82 mW, while the SAR-ADC-based FTL and the two R-2R DACs (operating at 1V) consume 0.1 mW and 1.5 mW, respectively. The power consumption of the QDCO ($V_{DD}=0.4V$) is 3.92 mW, while the two $3^{rd}$ harmonic extractors consume 10 mW. The total power consumption of the whole system is 16.5 mW.

Figure 14:
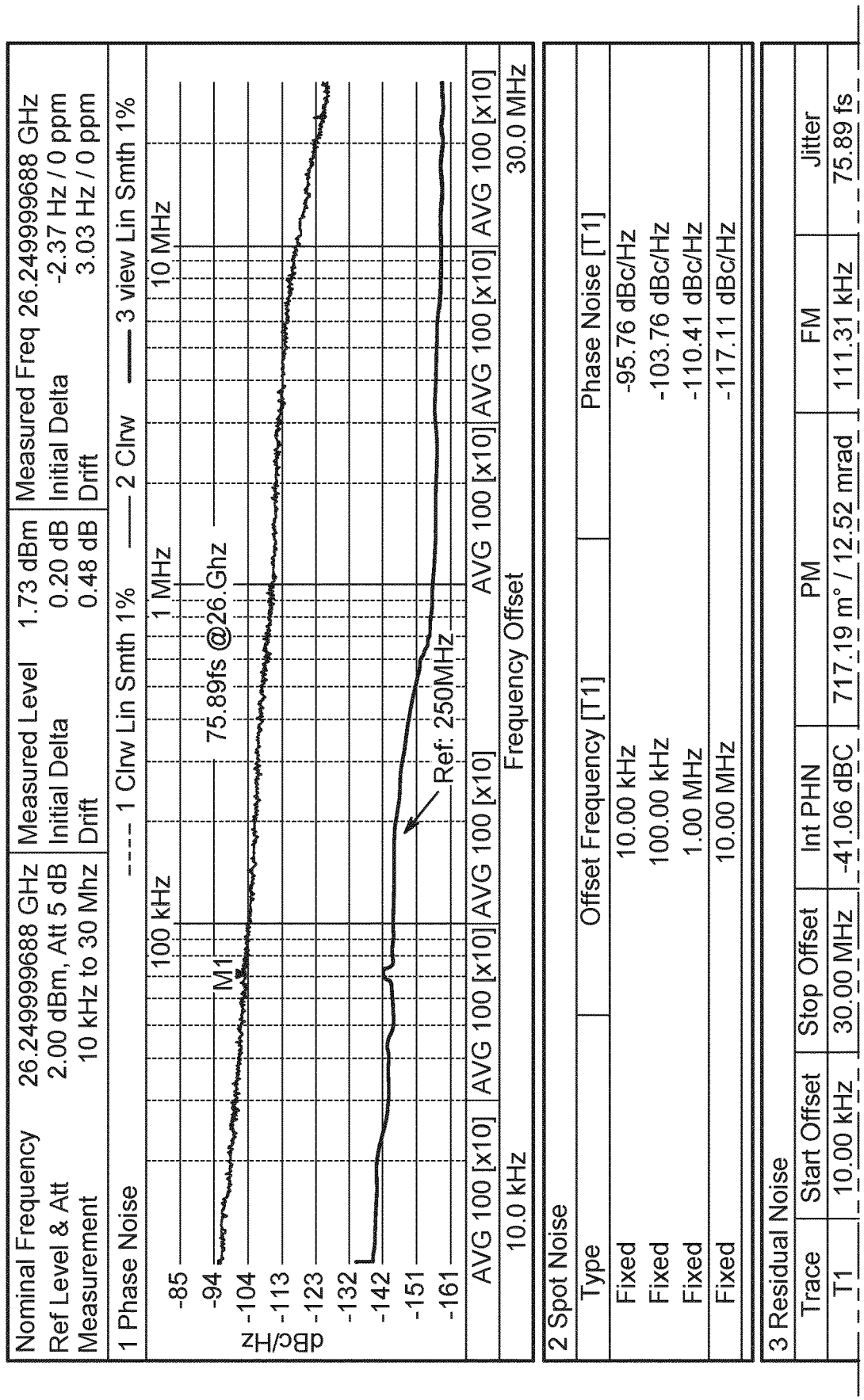
FIG. 14 provides graphical plots of a measured performance of an exemplary CSL-QPLL, consistent with embodiments of the present disclosure.
Figure 14:
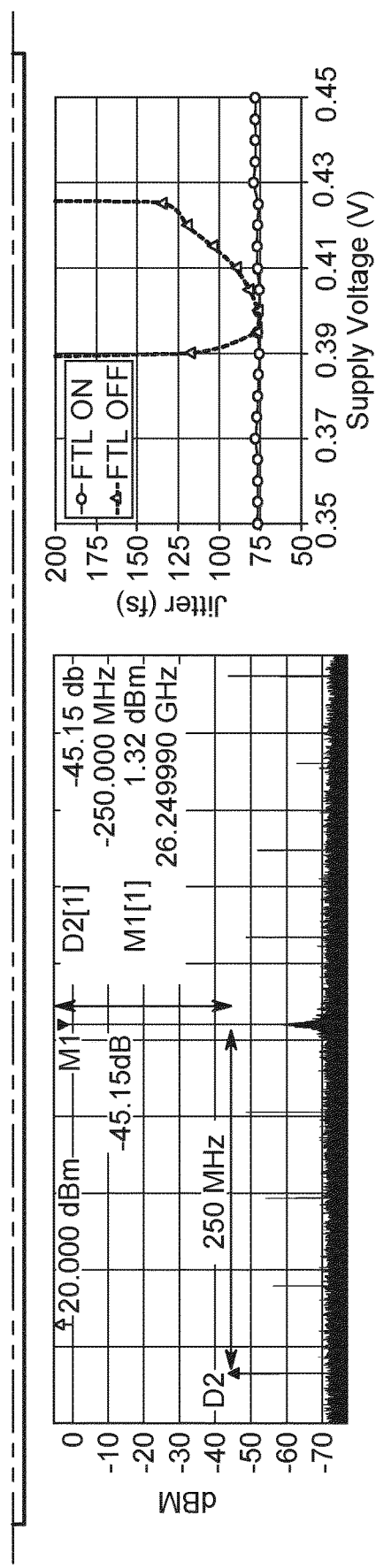

FIG. 14 provides exemplary graphical plots comprising a measured performance of the proposed CSL-PLL. The RMS jitter is 75 fs at 26.25 GHz, while the reference spur is –45 dBc at 250 MHz. The in-band PN is –110.4 dBc/Hz at 1 MHz offset, dominated by the input reference noise. With the SAR-ADC-based FTL ON (operating at 250 MHz/4), the charge-sharing locking can maintain the jitter performance when $V_{DD}$ of oscillator changes from 0.35V to 0.45V, demonstrating the robustness of the exemplary CSL technique.

There are numerous advantages associated with the present teaching. It will be appreciated by those skilled in the art that the CSL technique and architecture of the present disclosure presents a number of advantages over the state-of-the-art injection locking techniques and systems. In one regard, the proposed charge-sharing locking technique can achieve low in-band phase noise with large bandwidth without quantization noise issues due to the high-slew rate of the RF oscillator waveform and DAC resolution. What is more, unlike traditional injection locking which is limited to integer-N operation, i.e. operating in a single locked point, the proposed architecture of the present disclosure can pre-set the oscillator waveform at any locked point and results in the ability for fractional-N operation and phase control. Frequency calibration can be achieved by the information from the charge-sharing capacitor(s) $C_{share}$ without additional circuitry required in the loop except a low-power, low-speed ADC to quantize the feedback information into the digital domain. Moreover, due to the nonlinearity from the oscillator waveform, DAC non-linearity and other non-linear effects during charge-sharing injection can be compensated for in the digital domain by digital pre-distortion (DPD) in which the harmonic gains are calibrated thorough the exemplary waveform-learning algorithm as described in the foregoing. Further, existing techniques based on injection locking in integrated circuit design or laser/photonics could be replaced by the exemplary CSL with substantially improved robustness.

The invention is not limited to the embodiment(s) described herein but can be amended or modified without departing from the scope of the present invention.

It will be understood that while exemplary features of an apparatus for minimising in-band phase noise and jitter have been described that such an arrangement is not to be construed as limiting the invention to such features. The method for minimising in-band phase noise and jitter may be implemented in software, firmware, hardware, or a combination thereof. In one mode, the method is implemented in software, as an executable program, and is executed by one or more special or general purpose digital computer(s), such as a personal computer (PC; IBM-compatible, Apple-compatible, or otherwise), personal digital assistant, workstation, minicomputer, or mainframe computer. The steps of the method may be implemented by a server or computer in which the software modules reside or partially reside.

Generally, in terms of hardware architecture, such a computer will include, as will be well understood by the person skilled in the art, a processor, memory, and one or more input and/or output (I/O) devices (or peripherals) that are communicatively coupled via a local interface. The local interface can be, for example, but not limited to, one or more buses or other wired or wireless connections, as is known in the art.

The local interface may have additional elements, such as controllers, buffers (caches), drivers, repeaters, and receivers, to enable communications. Further, the local interface may include address, control, and/or data connections to enable appropriate communications among the other computer components.

The processor(s) may be programmed to perform the functions of the method for minimising in-band phase noise and jitter. The processor(s) is a hardware device for executing software, particularly software stored in memory. Processor(s) can be any custom made or commercially available processor, a primary processing unit (CPU), an auxiliary processor among several processors associated with a computer, a semiconductor based microprocessor (in the form of a microchip or chip set), a macro-processor, or generally any device for executing software instructions.

Memory is associated with processor(s) and can include any one or a combination of volatile memory elements (e.g., random access memory (RAM, such as DRAM, SRAM, SDRAM, etc.)) and non-volatile memory elements (e.g., ROM, hard drive, tape, CDROM, etc.). Moreover, memory may incorporate electronic, magnetic, optical, and/or other types of storage media. Memory can have a distributed architecture where various components are situated remote from one another, but are still accessed by processor(s).

The software in memory may include one or more separate programs. The separate programs comprise ordered listings of executable instructions for implementing logical functions in order to implement the functions of the modules. In the example of heretofore described, the software in memory includes the one or more components of the method and is executable on a suitable operating system (O/S).

The present disclosure may include components provided as a source program, executable program (object code), script, or any other entity comprising a set of instructions to be performed. When a source program, the program needs to be translated via a compiler, assembler, interpreter, or the like, which may or may not be included within the memory, so as to operate properly in connection with the O/S. Furthermore, a methodology implemented according to the teaching may be expressed as (a) an object oriented programming language, which has classes of data and methods, or (b) a procedural programming language, which has routines, subroutines, and/or functions, for example but not limited to, C, C++, Pascal, Basic, Fortran, Cobol, Perl, Java, and Ada.

When the method is implemented in software, it should be noted that such software can be stored on any computer readable medium for use by or in connection with any computer related system or method. In the context of this teaching, a computer readable medium is an electronic, magnetic, optical, or other physical device or means that can contain or store a computer program for use by or in connection with a computer related system or method. Such an arrangement can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this disclosure, a "computer-readable medium" can be any means that can store, communicate, propagate, or transport the program for use by or in connection with the instruction execution system, apparatus, or device. The computer readable medium can be for example, but not limited to, an electronic, magnetic, optical, electromagnetic, infrared, or semiconductor system, apparatus, device, or propagation medium. Any process descriptions or blocks in the Figures, should be understood as representing modules, segments, or portions of code which include one or more executable instructions for implementing specific logical functions or steps in the process, as would be understood by those having ordinary skill in the art.

The above detailed description of embodiments of the disclosure is not intended to be exhaustive nor to limit the disclosure to the exact form disclosed. While specific examples for the disclosure are described above for illustrative purposes, those skilled in the relevant art will recognize various modifications are possible within the scope of the disclosure. For example, while processes and blocks have been demonstrated in a particular order, different implementations may perform routines or employ systems having blocks, in an alternate order, and some processes or blocks may be deleted, supplemented, added, moved, separated, combined, and/or modified to provide different combinations or sub-combinations. Each of these processes or blocks may be implemented in a variety of alternate ways. Also, while processes or blocks are at times shown as being performed in sequence, these processes or blocks may instead be performed or implemented in parallel or may be performed at different times. The results of processes or blocks may be also held in a non-persistent store as a method of increasing throughput and reducing processing requirements.

The invention claimed is:

1. A phase-locked loop (PLL) for charge-sharing locking, the PLL comprising:
    a voltage pre-setting stage;
    an oscillator;
    a shared capacitive load operably coupled between the voltage pre-setting stage and the oscillator; and
    a switching network configured for selectively connecting the voltage pre-setting stage to the shared capacitive load during a phase of voltage pre-setting for applying an expectant voltage to the capacitive load, wherein the expectant voltage is pre-set on the capacitive load based on an expected output voltage of the oscillator, and the switching network being further configured for selectively connecting the capacitive load to the oscillator during a phase of charge-sharing locking for correcting a phase error as a result of a difference between the expected voltage of the capacitive load and the output voltage of the oscillator.

2. The PLL as claimed in claim 1, wherein the switching network comprises a first switch operable for selectively connecting the voltage pre-setting stage to the shared capacitive load.

3. The PLL as claimed in claim 1, wherein the switching network comprises a second switch operable for selectively connecting the shared capacitive load to the oscillator.

4. The PLL as claimed in claim 1, wherein the voltage pre-setting stage comprises a digital-to-analogue converter (DAC).

5. The PLL as claimed in claim 1, wherein the voltage pre-setting stage further comprises a digital block for providing a discrete and constant waveform to an input of DAC for integer-N operation.

6. The PLL as claimed in claim 1,
wherein the voltage pre-setting stage comprises a digital block for providing a discrete and aliased sinusoidal waveform to an input of the DAC for fractional-N operation.

7. The PLL as claimed in claim 1, wherein a frequency tracking loop is provided between the shared capacitive load and a digitally controlled oscillator (DCO).

8. The PLL as claimed in claim 1, wherein the oscillator comprises one of: an LC oscillator, a ring oscillator, a quadrature oscillator, a relaxation oscillator, or a rotary travelling-wave oscillator (RTWO).

9. The PLL as claimed in claim 1, wherein the frequency tracking loop is configured to sample a charge residue of the capacitor load.

10. The PLL as claimed in claim 1, wherein the frequency tracking loop comprises an analogue-to-digital convertor, ADC, an infinite impulse response filter and a digital integrator.

11. A method of charge-sharing locking for use in a PLL, the method comprising:
providing a voltage pre-setting stage;
providing an oscillator;
providing a shared capacitive load operably coupled between the voltage pre-setting stage and the oscillator;
selectively connecting the voltage pre-setting stage to the shared capacitive load during a first phase for applying an expectant voltage to the capacitive load, wherein the expectant voltage is pre-set on the capacitive load based on an expected output voltage of the oscillator; and
selectively connecting the capacitive load to the oscillator for phase error correction during a second phase in response to a voltage difference between the expected voltage of the capacitor and the voltage of the oscillator.

12. The method of claim 11, further comprising sampling a charge residue of the shared capacitive load using a frequency tracking loop.

13. The method of claim 11, further comprises utilising a waveform-learning algorithm for learning the waveform of the oscillator for suppressing fractional-N spur.

14. An apparatus for use in a communications network or a radar system, the apparatus comprising a PLL as claimed in claim 1.

15. A phase-locked loop (PLL) for charge-sharing locking, the PLL comprising:
a voltage pre-setting stage;
an oscillator;
a shared capacitive load; and
a switching network configured for selectively connecting the voltage pre-setting stage to the shared capacitive load during a phase of voltage pre-setting for applying an expectant voltage to the capacitive load; the switching network being further configured for selectively connecting the capacitive load to the oscillator during a phase of charge-sharing locking for correcting a phase error in response to a difference between the expected voltage of the capacitor and the output voltage of the oscillator.

16. A method of charge-sharing locking for use in a PLL, the method comprising:
providing a voltage pre-setting stage;
providing an oscillator;
providing a shared capacitive load;
selectively connecting the voltage pre-setting stage to the shared capacitive load during a first phase for applying an expectant voltage to the capacitive load; and
selectively connecting the capacitive load to the oscillator for phase error correction during a second phase in response to a voltage difference between the expected voltage of the capacitor and the voltage of the oscillator.

* * * * *